United States Patent [19]

Lee

[11] Patent Number: 5,233,419
[45] Date of Patent: Aug. 3, 1993

[54] VERTICAL DEFLECTION DEVICE OF HIGH DEFINITION TELEVISION

[75] Inventor: Il Lee, Kumi, Rep. of Korea

[73] Assignee: Goldstar Co., Ltd., Seoul, Rep. of Korea

[21] Appl. No.: 807,647

[22] Filed: Dec. 16, 1991

Related U.S. Application Data

[63] Continuation of Ser. No. 428,999, Oct. 30, 1989, abandoned.

[30] Foreign Application Priority Data

Oct. 31, 1988 [KR] Rep. of Korea .................. 14192

[51] Int. Cl.⁵ .............................................. H04N 3/16
[52] U.S. Cl. ...................................... 358/139; 358/158; 358/188
[58] Field of Search ............... 358/158, 160, 188, 139; 315/367, 364, 370, 387, 379

[56] References Cited

U.S. PATENT DOCUMENTS

| | | | |
|---|---|---|---|
| 4,099,092 | 7/1978 | Bristow | 315/367 |
| 4,760,313 | 7/1988 | Mallinson | 315/367 |
| 4,870,329 | 9/1989 | Ara | 315/367 |
| 4,933,769 | 6/1990 | Moas et al. | 315/367 |

FOREIGN PATENT DOCUMENTS 0099675  4/1988  Japan.
0196174  8/1988  Japan.

*Primary Examiner*—John K. Peng
*Assistant Examiner*—David E. Harvey

[57] ABSTRACT

A vertical deflecting device for use in high defining television receivers which includes an output of a controller connected to a non-volatile memory which is applied through a low pass filter, a digital/analog converter, and an amplifier to one side of a vertical deflecting coil wherein the other side of the vertical deflecting coil is earthed, and a certain programming inputted into a microcomputer which is built therein for easily changing factors such as, for example, frequency, location of vertical deflection, and value of current into a data so that the variation concerning the vertical deflection can be easily changed by changing only data contents.

1 Claim, 3 Drawing Sheets

VERTICAL DEFLECTION DEVICE OF HIGH DEFINITION TELEVISION

This application is a continuation of application Ser. No. 07/428,999 filed on Oct. 30, 1989, now abandoned.

BACKGROUND OF THE INVENTION

1. Field of the Invention

The present invention relates to a vertical deflecting system for use in high definition television sets and more particularly, to an improved vertical deflecting device for use in high definition television receivers which includes an output of a controller connected to a non-volatile memory which is applied through a low pass filter, a digital/analog converter, and an amplifier to one side of a vertical deflecting coil wherein the other side of the vertical deflection coil is grounded, and certain programming inputted into a microcomputer which is installed therein.

2. Description of the Prior Art

Various types of vertical deflecting systems for use in high definition television sets are well known in the art. For example, in such vertical deflecting systems, the amount of vertical deflection is determined in accordance with a magnetic flux produced by a deflecting coil which is originally produced in the television sets. However, such deflecting current cannot accurately activate a high definition screen display because it has defects in quality and linearity which are not suitable for driving the deflection coil in a high definition system.

SUMMARY OF THE INVENTION

Accordingly, it is an object of the present invention to provide an improved vertical deflecting system for use in a television set.

Another object of the present invention is to provide an improved vertical deflecting device for use in high definition television receivers which includes an output of a controller connected to a non-volatile memory which is applied through a low pass filter, a digital/analog converter, and an amplifier to one side of a vertical deflecting coil wherein the other side of the vertical deflection coil is grounded, and certain programming inputted into a microcomputer which is built therein for activating a high definition screen display and improving quality and linearity of the display on the screen of the television receiver.

A further object of the present invention is to provide an improved vertical deflecting system for use in a television set for easily changing factors such as, for example, frequency, location of vertical deflection, and value of current into digital data so that variations, concerning the vertical deflection signal can be easily changed by changing only digital data content.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

Briefly described, the present invention relates to an improved vertical deflecting device for use in high definition television receivers which includes an output of a controller connected to a non-volatile memory which is applied through a low pass filter, a digital/analog converter, and an amplifier to one side of a vertical deflecting coil wherein the other side of the vertical deflecting coil is grounded, and certain programming inputted into a microcomputer which is built therein for easily changing factors such as, for example, frequency, location of vertical deflection, and value of current into data so that the variation concerning the vertical deflection can be easily changed by changing only data content.

BRIEF DESCRIPTION OF THE DRAWINGS

The present invention will become more fully understood form the detailed description given hereinbelow and the accompanying drawings which are given by way of illustration only, and thus are not limitative of the present invention, and wherein.

DESCRIPTION OF THE PREFERRED EMBODIMENTS

Figure 1:
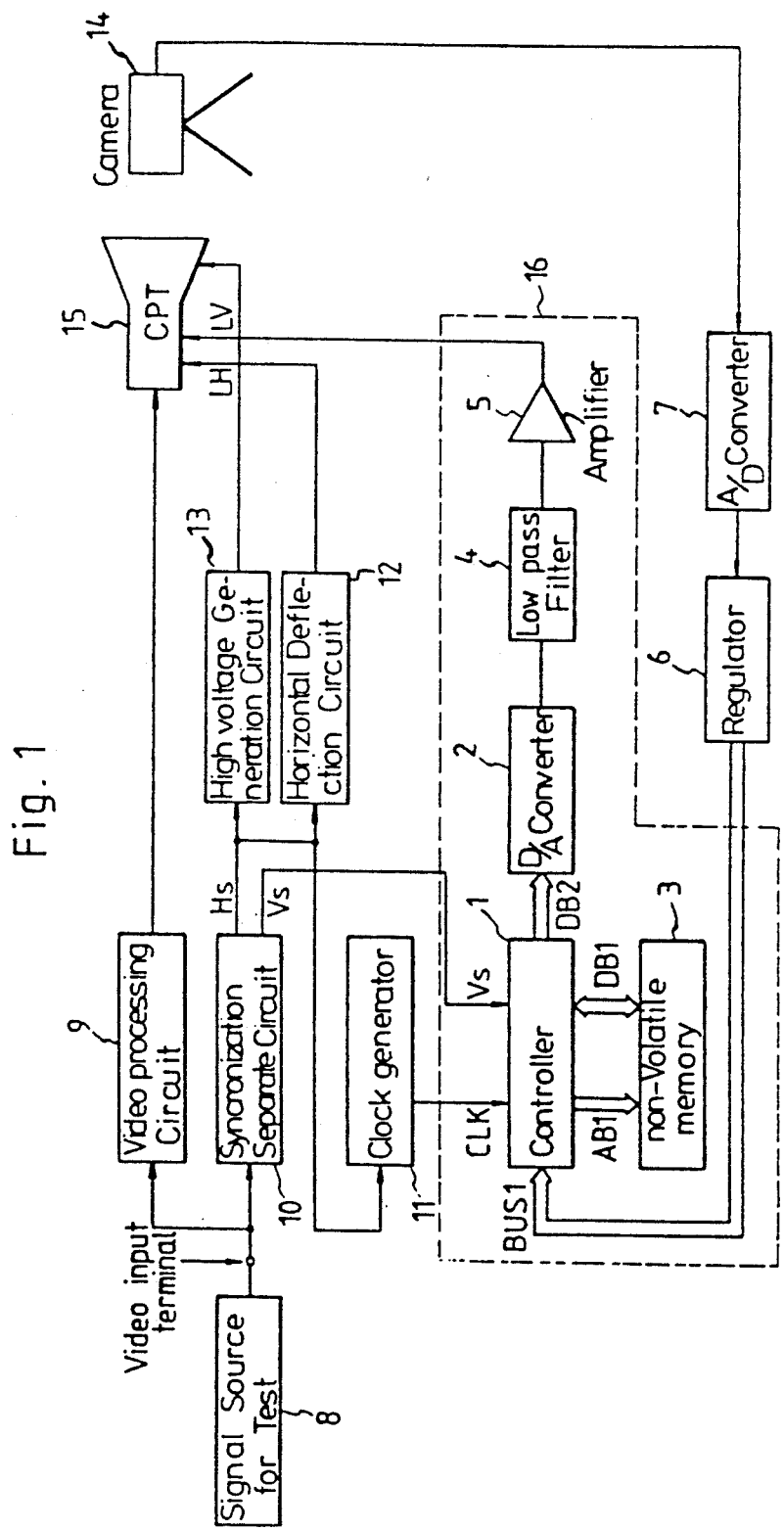
FIG. 1 is a block diagram of the vertical deflecting system for use in high definition television sets according to the present invention.
Figure 3:
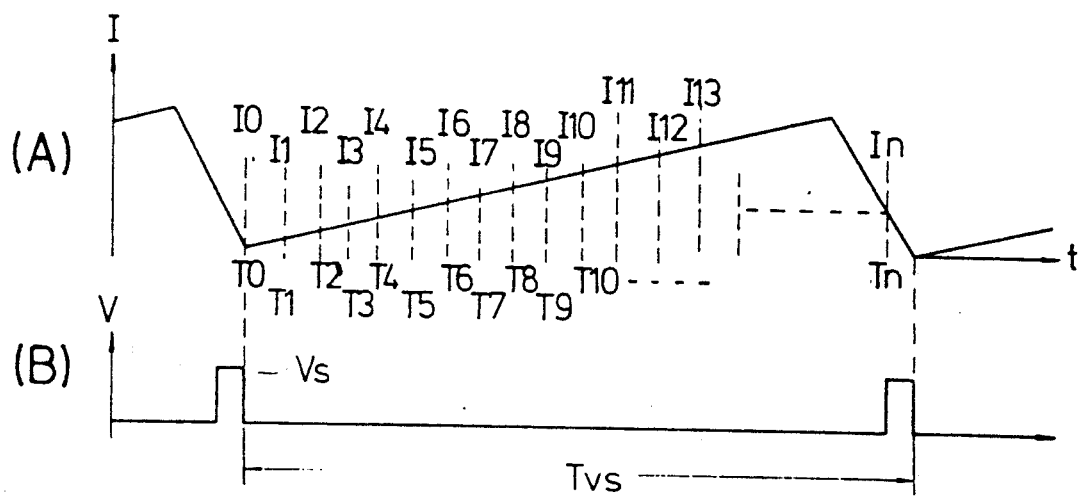
FIGS. 3(A) and 3(B) are current and voltage wave forms along a plurality of successive intervals of the vertical deflection signal according to the present invention.

Referring now in detail to the drawings for the purpose of illustrating preferred embodiments of the present invention, the vertical deflecting system for use in high definition television sets as show in FIGS. 1 and 3 comprises an output signal of a signal source for test 8 applied to a video input terminal of a television set, and a video processing circuit 9 connected to the video input terminal. The video signal produced at the video processing circuit 9 is supplied to a color picture tube (CPT) 15. A horizontal synchronized signal Hs and a vertical synchronized signal Vs which are separated from the video signal and supplied to a high voltage generation circuit 13 and a horizontal deflection circuit 12 as the input signals, respectively. The output of the high voltage generation circuit 13 and horizontal deflection circuit 12 are applied to the CPT 15 for producing the horizontal deflection by producing deflecting current in a deflecting yoke and supplying the high voltage to CPT 15.

A clock generator 11 generates a frequency much greater than the frequency of the horizontal synchronized signal Hs and vertical synchronized (vertical synch) signal Vs outputted from the synchronization separate circuit 10. An output clock signal CLK of the clock generator 11 is inputted to the vertical deflecting device in accordance with the present invention. These signals (CLK, Vs) are used in a controller 1 according to the following steps:

The controller 1 connected to a control adjust bus BUS1 and receiving a vertical synchronized signal Vs of an output terminal of synchronization separate circuit 10 is connected to a non-volatile memory 3 through an address bus AB1 and a first data bus DB1 and also is connected to a digital/analog converter 2 through a second data bus DB2.

The output of the digital/analog converter 2 is connected to one side of vertical deflecting coil Lv through a low pass filter 4 and an amplifier 5 wherein the other side vertical deflection coil L is grounded.

The program stored in a microcomputer within the controller 1 performs at least four steps. In the first step, after initialization of the microcomputer, whether the control adjust bus BUS1 is used or not is detected. In the second step, when the control adjusting bus BUS1 is not used, whether the vertical synchronized signal Vs exists or not is detected. Thereafter, when there is no vertical synchronized signal Vs present, the first step of detecting a control adjusting bus BUS1 is repeated with the sending of basic data of a vertical deflecting current divided into n increments To-Tn. When the vertical synchronized signal Vs is present, the vertical deflecting current Io-In is read out from the memory 3. When there is no vertical synchronized signal Vs, data from memory 3 is sent to a second data bus DB2 and the first step of detecting status of the control adjust bus BUS1 is repeated. In the third step, when the control adjust bus BUS1 of the first step is in use after performing the operation in accordance with the status of the control adjust bus BUS1, the basic data in memory 3 corresponding to the vertical deflecting current Io-In for the period To-Tn is sent to the second data bus DB2. Thereafter, when the use of the control adjust bus BUS1 is ended, the second step is repeated. When the use of the control adjust bus BUS1 is complete, whether the vertical synchronized signal Vs was present or not is detected. In a fourth step, when there is no vertical synchronized signal Vs present, the procedure of the third step again sends the basic data from memory 3 to the second data bus DB2 while the vertical deflecting current Io-In for the period, To-Tn is returned to memory 3.

As shown in FIGS. 3(A) and 3(B), a magnetic flux induced in the coil of the deflecting yoke makes vertical and horizontal deflection of an electron beam in the CPT 15 so that the current in the coil has a direct relation with the deflection. The current of a vertical deflecting (sweep) circuit 16 of the device according to the present invention is adjusted while a television is manufactured for improving the linearity of the high definition screen display. A deflecting current Io-In according to the vertical deflection current Io-In for the period To-Tn made by dividing 1 cycle of the vertical deflecting by a numeral n the number of increments, as shown in FIG. 3 is generated to form a vertical sweep signal.

Furthermore, an image signal of the image of a test sweep signal on CPT15 inputted from a television camera 14 which is positioned in front of the CPT15. Camera 14 changes the image corresponding to the test sweep signal into digital data with use of analog/digital converter 7 (FIG. 1). The digital signal is applied to a regulator 6 which processes the data and depending on the status of the vertical sweep signal determines values, to stabilize the vertical deflection. Thereafter, the regulator 6 sends the values to the controller 1 through the control adjust bus BUS1, for correcting the vertical sweep signal. Such correction can be repeated until the status becomes optimum.

As shown in FIG. 1, a quantized data D(n) becomes an analog output voltage V(n) at the output of amplifier 5 for generating the deflecting current Io-In corresponding to the vertical deflecting current To-Tn. The low pass filter 4 removes high band components from the output of digital/analog converter 2 which produces V(n) according to D(n) memorized in the memory 3. The controller 1 receives the basic clock pulse CLK and vertical synchronized signal Vs as shown in FIG. 3(B) for controlling the basic clock pulse CLK and vertical synchronized signal Vs with the control signal inputted through control adjust bus BUS1. The controller 1 controls the deflection time, deflection voltage, deflection location and etc.

Figure 2:
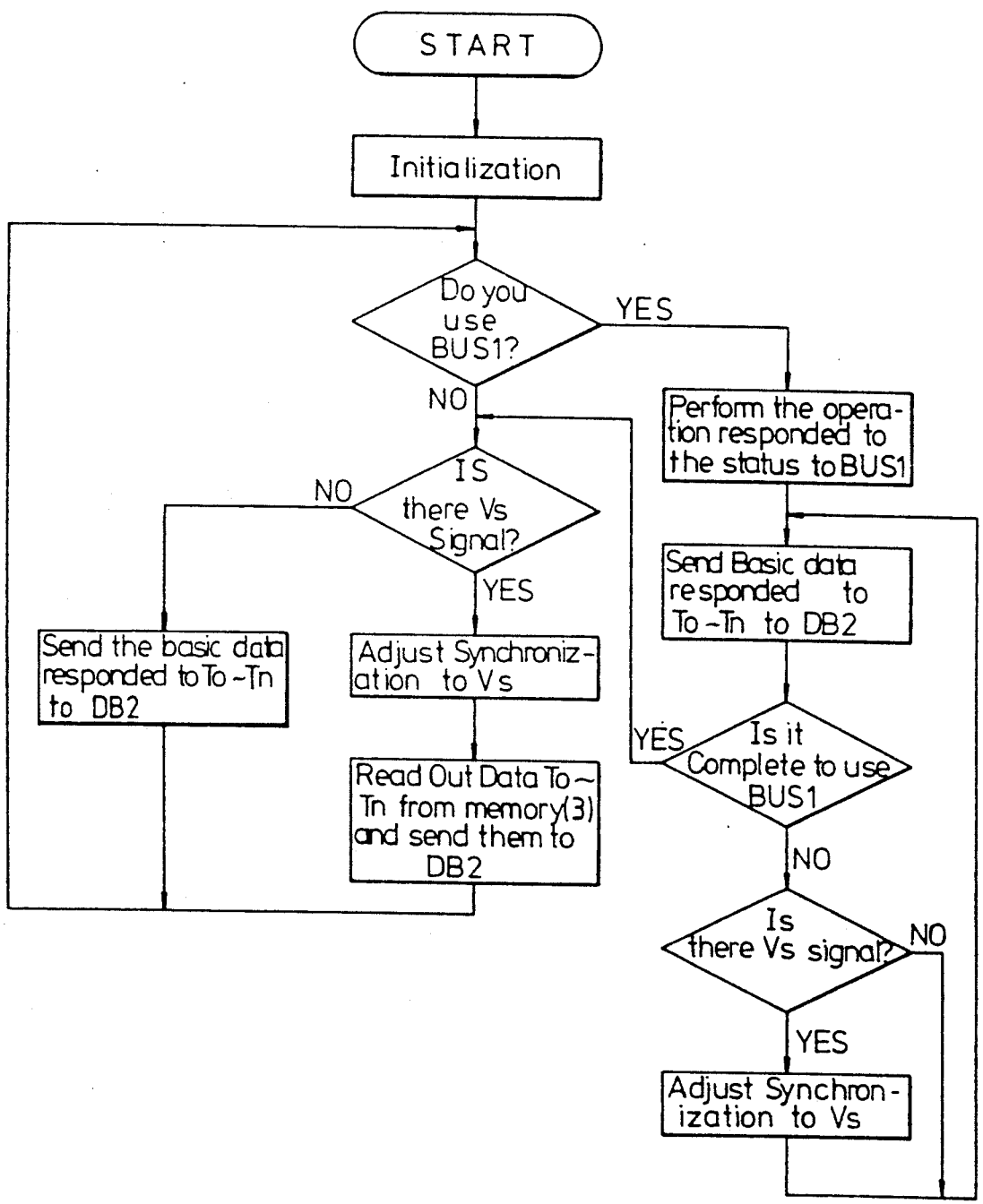
FIG. 2 is a flow chart of a program for operating the system of FIG. 1 according to the present invention.

On the other hand, when the control adjust bus BUS1 is utilized as shown in FIG. 2, the controller 1 operates as described hereinbefore. That is, the memorization and adjustment of certain data while the television set is being manufactured, are performed and controlled. Therefore, when the controller 1 starts to operate through the control adjust bus BUS1, the vertical deflection circuit 16 only operates in accordance with the contents of stored information in the memory 3.

The frequency of the clock pulse CLK is much larger than the vertical frequencies such as 1/TVS wherein TVS is one cycle of the vertical deflection. When the controller 1 operates according to the input status of the vertical synchronized signal Vs and synchronizes, the controller 1 reads and calculates the data corresponding to the To-Tn of FIG. 3(A) with a negligible time difference in comparison with synchronizing signal like FIG. 3(B). The controller outputs the voltage corresponding to the deflecting current Io at the vertical deflecting coil Lv.

From a time interval T1 to Tn, the controller 1 permits a deflecting current to flow in the vertical deflection coil Lv with increasing n increments sequentially. The vertical deflection according to the variation of current is performed accordingly.

The digital/analog converter 2 outputs the voltage corresponding to the input data. Since the output voltage is quantized and it has rapid waveform change through the low pass filter 4, the voltage waveform is inputted into the amplifier 5 with a substantially linear slope. When the vertical deflection is performed by the operation of circuit 16, the deflecting current of vertical deflection desired by the circuit designer can be obtained more easily than the variation rate of vertical deflecting current is corrected in accordance with the existing coil, condenser, resistor and transformer. The current value according to location of the screen can be controlled by a small time unit so as to display the accurate screen image. The standardization of screen deflection can be done by automatic adjustment. Therefore, the automatic adjustment by the machine during the process of manufacturing is possible. Although highly defined vertical deflection is not possible in the existing analog deflection circuit while controlling the vertical deflection corresponding to location of the screen by the small time unit having variable of contents in the controller 1, the variation of constants such as, for example, location of vertical deflection and frequency can be performed. All the conditions related to the vertical deflection can be changed by varying only the contents of data by adjusting current values having the data. Thus, the vertical deflecting system memorizes the current flowing in the vertical deflecting coil with the quantized value previously in the memory 3 and performs the vertical deflection with the value as a standard to display a high definition image on the screen of the television set.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. A method for generating a vertical sweep signal for use in a high definition television, comprising the steps of:

generating vertical sync signals for application to a CRT of the high definition television;

applying said vertical sync signals and clock signals to controller means and said controller means counts said clock signals for a period of said vertical sync signal including the steps of, dividing first periods of said vertical sync signals into a plurality of time intervals for subsequent quantization, converting said plurality of time intervals of said vertical sync signals into digital data, wherein the digital data represents a corrected vertical sweep signal to be applied to the CRT of the high definition television by an input bus, storing said digital data in non-volatile memory means, and outputting said digital data from said non-volatile memory means to an output bus;

generating a test, vertical sweep, signal of analog form and applying said test, vertical sweep, signal to a video input terminal of said high definition television for display on said CRT;

detecting an image of the test sweep signal displayed on said CRT;

outputting an analog signal corresponding to the test sweep signal;

digitizing the analog signal corresponding to said test sweep signal to produce digital data;

identifying the digital data from said step of digitizing;

outputting information derived from the identified data to said non-volatile memory means of said controller means;

retrieving digital data from said memory means, and supplying the digital data to the output bus in synchronism with the vertical sync signals;

converting the digital data in the output bus which is synchronized with said vertical sync signals directly into an analog form of a corrected vertical sweep signal; and applying said analog form of a corrected vertical sweep signal directly to a vertical deflection coil of said CRT as a vertical deflection current which constantly flows to said CRT when said vertical sync signals vary.

* * * * *